(12) United States Patent
Tamura

(10) Patent No.: US 7,082,025 B2
(45) Date of Patent: Jul. 25, 2006

(54) CAPACITOR DEVICE

(75) Inventor: Hiroyuki Tamura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 124 days.

(21) Appl. No.: 10/782,592

(22) Filed: Feb. 19, 2004

(65) Prior Publication Data

US 2004/0212058 A1    Oct. 28, 2004

(30) Foreign Application Priority Data

Feb. 20, 2003    (JP)    ............... P. 2003-043321

(51) Int. Cl.
*H01G 4/228*    (2006.01)
(52) U.S. Cl. ............... 361/306.1; 361/509; 361/532; 361/528
(58) Field of Classification Search ............ 361/306.1, 361/308.3, 329, 309, 508–510, 528–529, 361/517, 535, 538–539; 337/252, 232, 248
See application file for complete search history.

(56) References Cited

U.S. PATENT DOCUMENTS

| | | | | |
|---|---|---|---|---|
| 5,446,623 A | * | 8/1995 | Kanetake | ............... 361/760 |
| 5,502,614 A | * | 3/1996 | Kuriyama | ............... 361/534 |
| 5,583,740 A | * | 12/1996 | Fujino | ............... 361/534 |
| 5,781,401 A | * | 7/1998 | Tomiyasu et al. | ............ 361/303 |
| 6,259,348 B1 | * | 7/2001 | Kuriyama | ............... 337/252 |

* cited by examiner

*Primary Examiner*—Anthony Dinkins
(74) *Attorney, Agent, or Firm*—Fish & Richardson P.C.

(57) ABSTRACT

To provide a capacitor device that has a fusing feature and which can be made miniaturized, lighter in weight and thin-shaped, comprising a plurality of conductive pattern electrodes 20 and 21 electrically separated by a separation groove 19; a capacitor element 15 in which at least either one of an anode lead 16 and a cathode lead 17 is connected via a thin metal wire 22 having a fusing feature to the conductive pattern electrodes 20 and 21; and a insulating resin 24 for covering a part except for the capacitor element 15 and a part working as the conductive pattern electrodes and for integrally supporting the conductive pattern electrode and the capacitor element.

7 Claims, 6 Drawing Sheets

CAPACITOR DEVICE

BACKGROUND OF THE INVENTION

1. Field of the Invention

The present invention relates to a tantalum chip type capacitor device used for a portable device such as a telephone that is allowed to have a fusing feature.

2. Related Art

A tantalum chip type capacitor device has been used for a part such as a power source circuit for a portable device requiring a large capacity such as telephones, laptop computers, and miniaturized, lighter weight, and thin-shaped tantalum chip type capacitor devices have been demanded and a fusing feature has also been sought in terms of being used as a power source circuit.

FIG. 9 is a cross-sectional view showing a capacitor element of the chip tantalum capacitor.

As shown in FIG. 9, the capacitor element 1 is made in such a manner that tantalum (Ta) 2 in the form of metal powders and a tantalum bar for drawing out a lead wire are subjected to pressurization, molding and vacuum hardening, and in the surface thereof, a tantalum oxide film ($Ta_2O_5$) 4 used as a dielectric body is formed by electrochemical anodization.

As an electrolyte, a solid manganese dioxide layer ($MnO_2$) 5 is formed on the dielectric body by the thermal decomposition of manganese nitrate. In order to allow this manganese dioxide layer 5 to have thereon an electric connection, the graphite layer 6 is provided. On the graphite layer 6, a cathode lead 8 is formed by use of a silver covering material 7 and a conductive adhesive agent.

FIG. 10 is a schematic view of a conventional chip tantalum capacitor device using the capacitor element 1. As shown in FIG. 10, the anode terminal 9 which is bent in the shape of an overturned latter 1 is welded to the tantalum bar 3 of the capacitor element 1 provided as described above at a welding point 10. The cathode terminal 11 bent in a complicated manner is pressure-bonded to the cathode lead 8 formed of conductive adhesive agent. Furthermore, the capacitor element 1, the anode terminal 9, and the cathode terminal 11 are partially exposed to the exterior to be molded by an epoxy resin 12, thereby forming the chip tantalum capacitor.

As described above, bent and intricately-shaped electrode elements have been used for an anode lead and a cathode lead of conventional chip tantalum capacitor devices, thus requiring man-hours and cost. Additionally, bent and intricately-shaped electrode elements have been used, therefore, miniaturized, lighter weight and thin-shaped chip capacitors cannot be achieved.

If the conventional chip tantalum capacitor has a fusing feature, the capacitor cannot be prevented from being larger and thicker because of the inclusion of the fusing feature, which is contrary to the need for a miniaturized, lighter weight and thin-shaped chip capacitor. In this case, additional labor has been required for including the fuse.

SUMMARY OF THE INVENTION

The capacitor device of preferred embodiment of the present invention is miniaturized, thin-shaped and lighter in weight, and the preferred embodiment provides a chip capacitor having a fusing feature. The present invention provides a capacitor device comprising a plurality of conductive pattern electrodes electrically separated by a separation groove; a capacitor element in which at least either one of an anode lead or a cathode lead is connected to the conductive pattern electrode via a thin metal wire having a fusing feature, and an insulating resin for covering a part except for the capacitor element, the thin metal wire, and a part working as the conductive pattern electrode and for integrally supporting the conductive pattern electrode, the thin metal wire, and the capacitor element.

The preferred embodiment provides a capacitor device comprising a plurality of conductive pattern electrodes electrically separated by a separation groove; a capacitor element in which at least either one of an anode lead or a cathode lead is connected to first and second conductive pattern electrode via a thin metal wire having a fusing feature, respectively, a circuit element bare chip attached to a third conductive pattern electrode; and an insulating resin for covering the capacitor element, parts working as the bare chip, the thin metal wire, and a part except for the first, second and third conductive pattern electrodes and for integrally supporting the first, second and third conductive pattern electrodes, the capacitor element, and the bare chip.

Accordingly, a complicated metal fitting used for an anode terminal and a cathode terminal as an electrode as in the conventional chip capacitor becomes unnecessary, thereby realizing a miniaturized, lighter weight and thin-shaped capacitor device.

Further, the capacitor element as well as another circuit element chip forming a hybrid integrated circuit are simultaneously attached to the conductive pattern and are covered and fixed with the insulating resin, thereby forming a hybrid integrated circuit in which the capacitor element is assembled.

FIG(S). 2A–2C are side view illustrating a manufacturing process of the capacitor device of the preferred embodiment.

FIG(S). 3A–3C are side view illustrating a manufacturing process of the capacitor device of the preferred embodiment.

FIG(S). 4A–4D are side view illustrating another manufacturing process of the capacitor device of the preferred embodiment.

Figure 5:
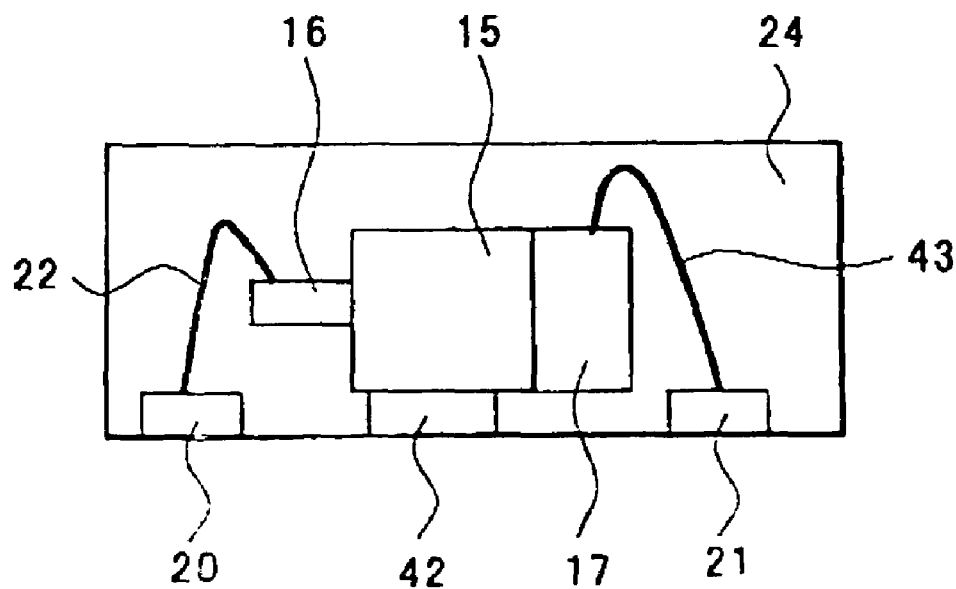

FIG. 5 is a side view showing another embodiment of the capacitor device of the preferred embodiment.

Figure 6:
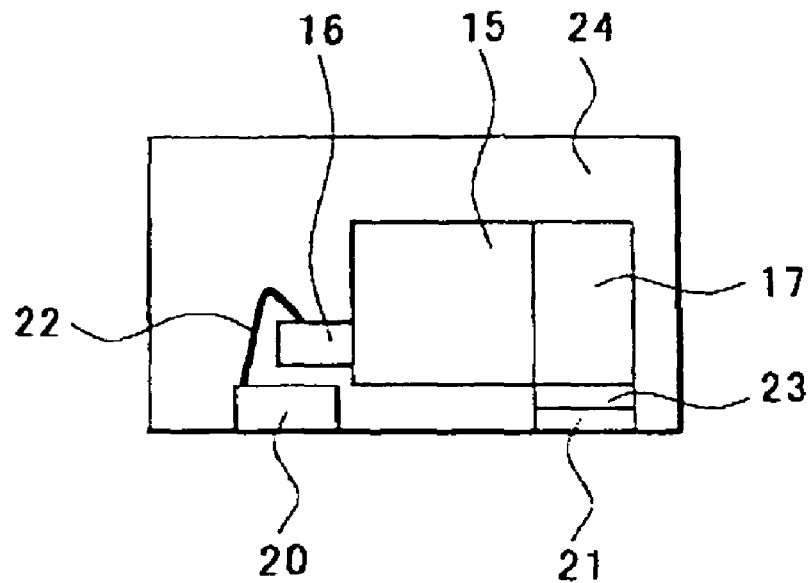

FIG. 6 is a side view showing another embodiment of the capacitor device of the preferred embodiment.

Figure 7:
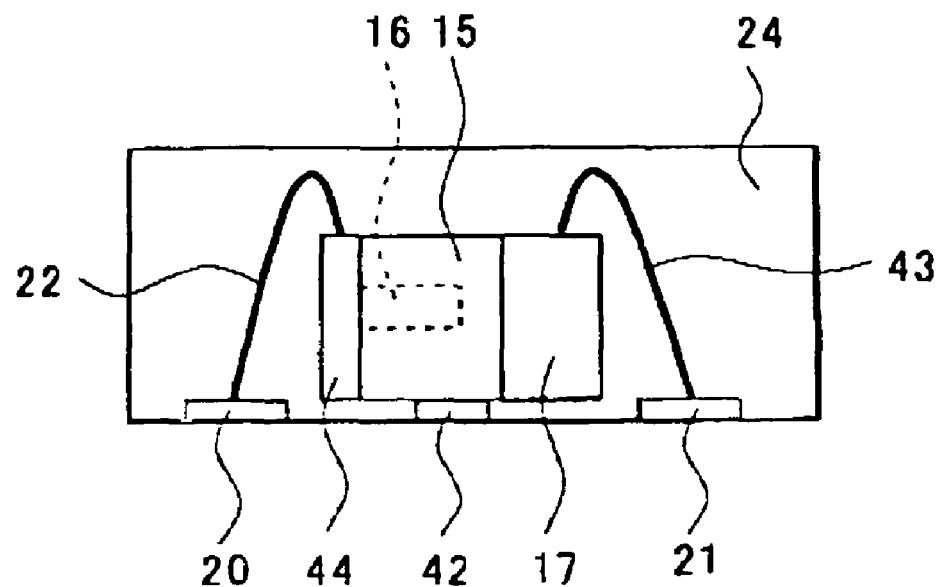

FIG. 7 is a side view showing another embodiment of the capacitor device of the preferred embodiment.

Figure 8:
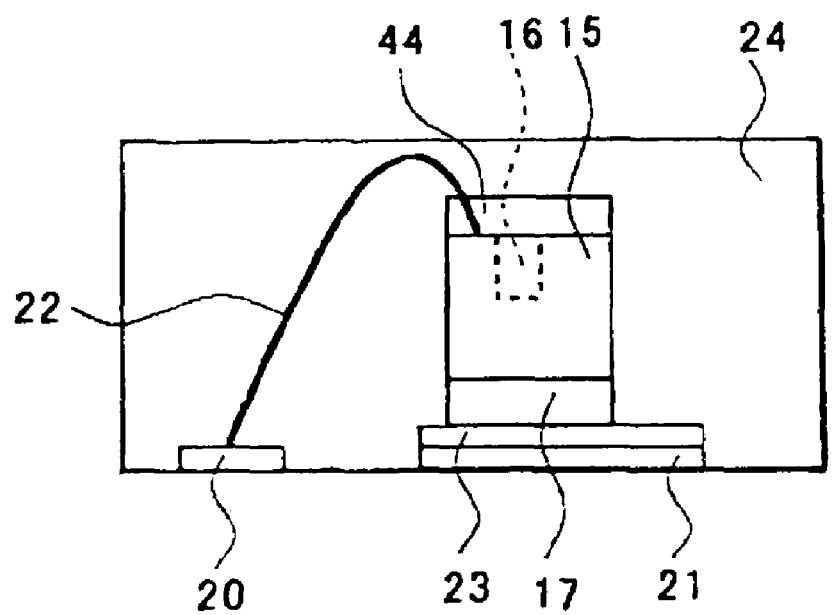

FIG. 8 is a side view showing another embodiment of the capacitor device of the preferred embodiment.

Figure 9:
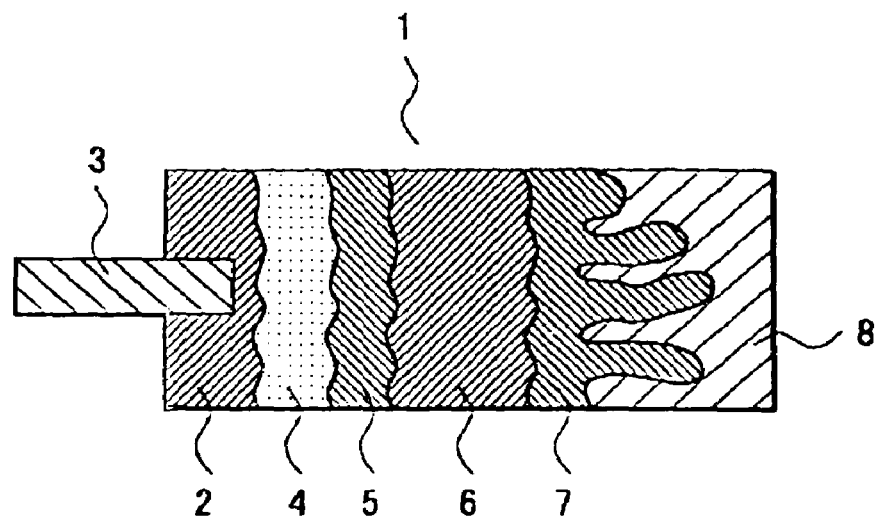

FIG. 9 is a cross-sectional view showing the capacitor elements used for the capacitor devices of the preferred embodiment and the related art.

Figure 10:
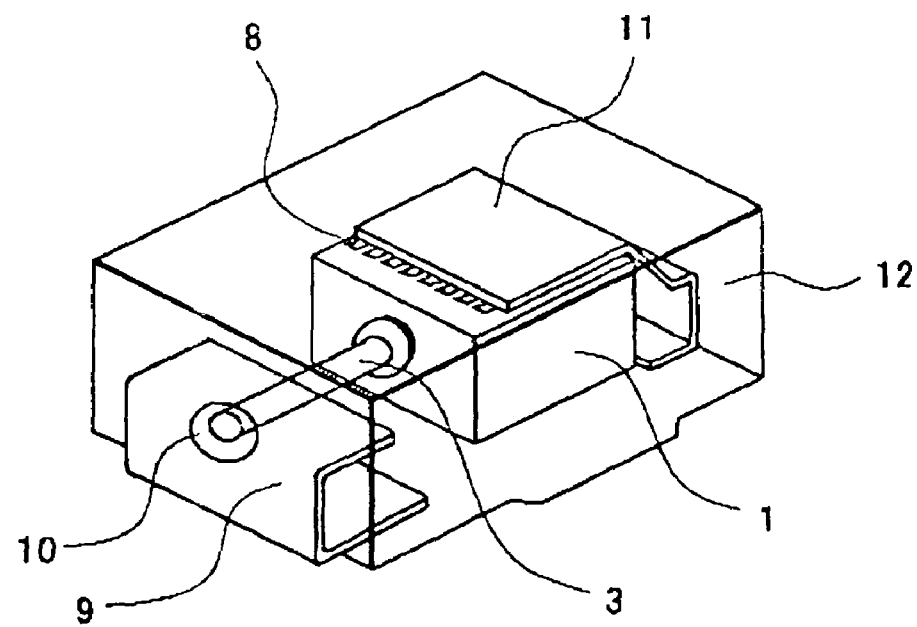

FIG. 10 is a schematic view showing the conventional chip tantalum capacitor.

DESCRIPTION OF THE PREFERRED EMBODIMENTS

The capacitor device of the preferred embodiment will be described with reference to FIG. 1 to FIG. 8.

Figure 1:
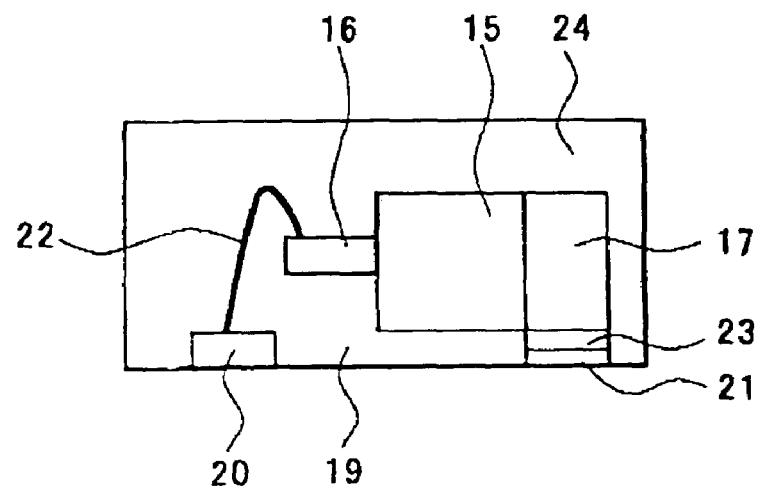
FIG. 1 is a side view showing the capacitor device of the preferred embodiment.

FIG. 1 is a side view illustrating the capacitor device of the preferred embodiment. The capacitor element 15 has an anode lead 16 that is provided, as described above, by subjecting the tantalum Ta in the form of metal powders and the tantalum bar to pressurization, molding, and vacuum hardening. The capacitor element 15 has also a cathode lead 17 that is provided with a graphite layer and a conductive adhesive agent on the manganese dioxide layer which is made into a dielectric body consisting of a tantalum oxide film.

The anode lead 16 and the cathode lead 17 of the capacitor element 15 are constructed by a hybrid integrated circuit technique (which will be described later) and is connected to first and second conductive pattern electrodes 20 and 21 separated by the separation groove 19. The anode lead 16 is connected via the thin metal wire 22 having a fusing feature. The one end of the thin metal wire 22 is subjected to wire-bonding to be connected to the anode lead 16, while the other end is connected to the first conductive pattern electrode 20.

In order to connect the thin metal wire 22 to the anode lead 16, a flat section (e.g., a bonding pad) is required to be formed so that the thin metal wire 22 can be subjected to a wire bonding to connect to a tantalum bar working as the anode lead 16. Further, the thin metal wire 22 is plated so as to be subjected to a wire bonding. The thin metal wire 22 also may be welded instead of being subjected to a wire bonding.

The thin metal wire 22 is composed of aluminum, gold or the like. The capacity of the fusing current is adjusted depending on the number of wires to be bonded.

The cathode lead 17 is soldered to the second conductive pattern 21 with a solder 23. The cathode lead 17 is directly soldered and fixed to the second conductive pattern electrode 21 with the solder 23. Alternatively, the cathode lead 17 also may be fixed by Ag paste or an electrically conductive adhesive agent instead of being soldered.

The capacitor element 15, the anode lead 16, the cathode lead 17, the thin metal wire 20, and the first and second conductive pattern electrodes 20 and 21 except for the lower faces are covered with the insulating resin 24 and integrally supported by the insulating resin 24, thereby forming the chip type capacitor device.

In the capacitor device, the lower faces of the first and second conductive pattern electrodes 20 and 21 are exposed, thus allowing capacitor device to be directly attached to a printed circuit of a printed substrate to form a power source circuit or the like. If the capacitor element 15 has a short circuit due to some reason, a large current flows in the circuit, and this may cause burnout of the circuit element or the like. However, the capacitor device of the preferred embodiment allows the thin metal wire 22 to be firstly fusion-cut, thereby preventing other circuit elements from being burnt out.

In the above description, the anode lead 16 of the capacitor element 15 is connected to the first conductive pattern electrode 20 via the thin metal wire 22 having a fusing feature, however, the cathode lead 17 also may be connected to the second conductive pattern electrode 21 via the thin metal wire having a fusing feature.

Figure 2A:
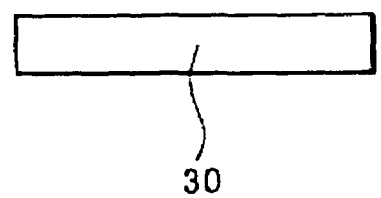
Figure 2B:
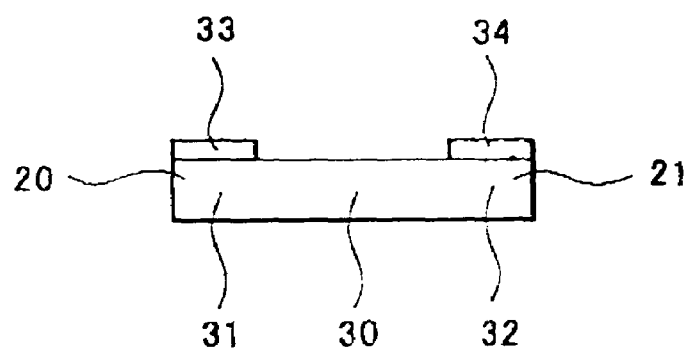

FIG. 2 and FIG. 3 are side views illustrating the process for assembling the capacitor device of FIG. 1 using a special hybrid integrated circuit technique. First, the conductive foil 30 is prepared as shown in FIG. 2A. The conductive foil is mainly composed of Cu but also may be composed mainly of Al or may composed of an alloy such as Fe—Ni or the like.

Figure 2C:
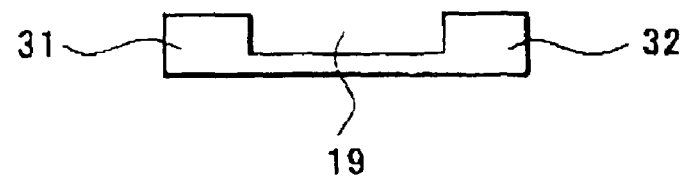

Next, as shown in FIG. 2E, photoresists are patterned such that the conductive foil 30 is exposed except for a region working as the conductive patterns 31 and 32 constituting the first and second conductive pattern electrodes 20 and 21 of the conductive foil. Then, as shown in FIG. 2C, the conductive foil 30 is selectively etched to form a plurality of conductive patterns 31 and 32 separated by the separation groove 19. In this status, a part working, as the first and second conductive pattern electrodes 20 and 21 of the conductive patterns 31 and 32 is separated by the separation groove 19 but the lower part is connected.

Figure 3A:
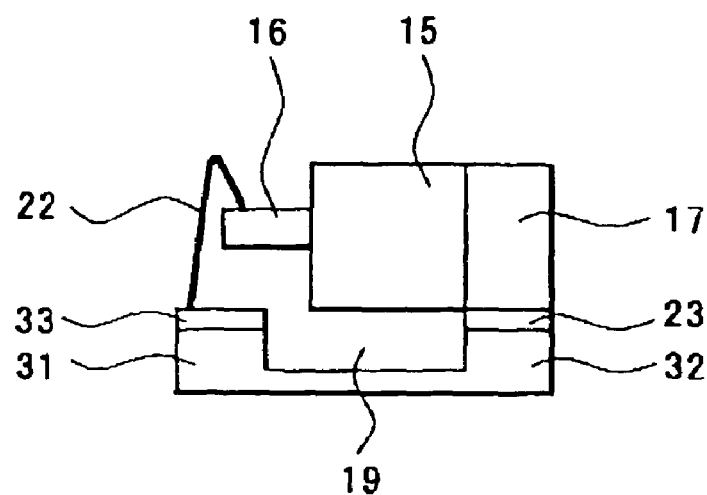

Thereafter, as shown in FIG. 3A, the cathode lead 17 of the capacitor element 15 is soldered and fixed to the conductive pattern 32 with the solder 23. Then, one end of the thin metal wire 22 is bonded to the bonding pad of the anode lead 16 of the capacitor element 15. The other end of the thin metal wire 22 is bonded to a wire bonding pad 33 of the conductive pattern 31, thereby connecting the anode lead 16 of the capacitor element 15 to the conductive pattern 31. In this case, the conductive patterns 31 and 32 are still connected, thus facilitating the operation.

Figure 3B:
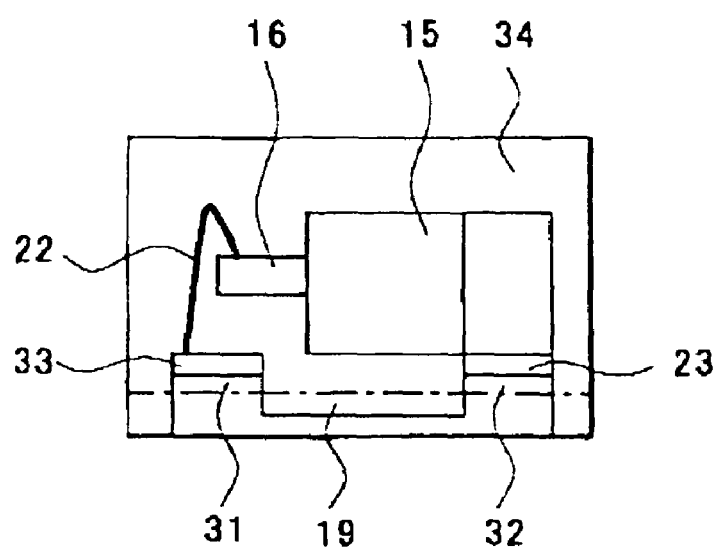
Figure 3C:
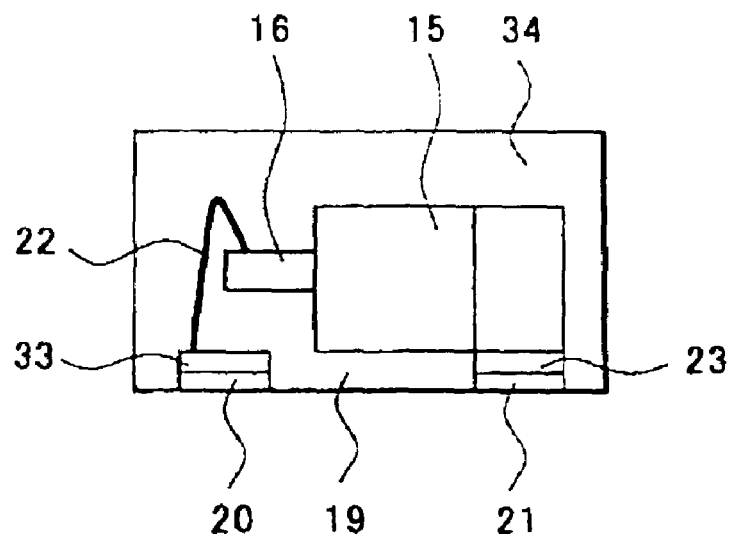

Thereafter, as shown in FIG. 3B, the capacitor element 15, the anode lead 16, the cathode lead 17, the thin metal wire 22, and the conductive patterns 31 and 32 are entirely covered with the insulating resin 34 and these are supported and fixed. Finally, the insulating resin 34 is cut off from the conductive patterns 31 and 32 at a broken line shown in FIG. 3B. This allows as shown in FIG. 3C the conductive pattern 31 to be perfectly separated from the conductive pattern 32 and the lower part of the separated part becomes the externally exposed the first and second conductive pattern electrodes 20 and 21 in which the conductive patterns 31 and 32 are exposed. Specifically, the capacitor device shown in FIG. 1 is completed.

In FIG. 2 and FIG. 3, only the capacitor device is assembled by a hybrid integrated circuit technique, FIG. 4 is a side view illustrating the process for assembling the capacitor device with other circuit elements.

Figure 4A:
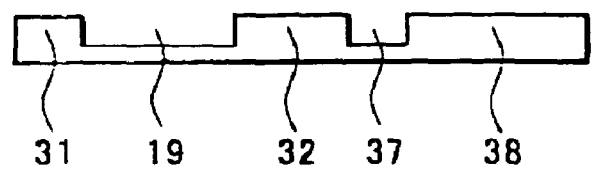

In FIG. 4A, as described above, the conductive patterns 31 and 32 are formed in which the parts working as the conductive pattern electrodes are separated at the separation groove 19 and a third conductive pattern 38 is also formed in which a part working as a flip chip pad 38A is separated by a separation groove 37.

Figure 4B:
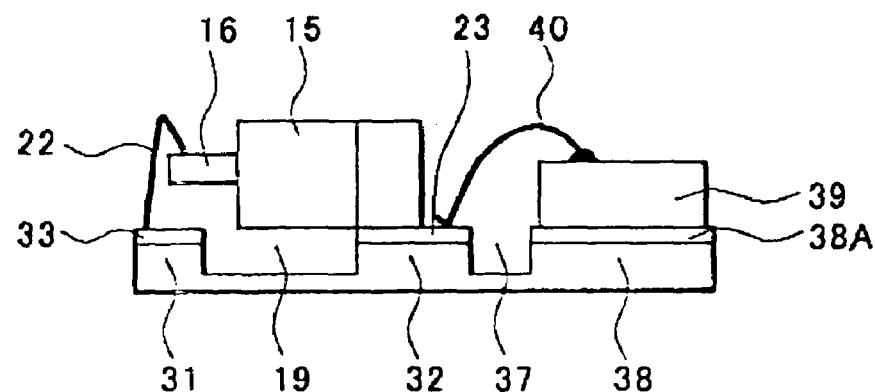

Next, as shown in FIG. 4B, the cathode lead 17 of the capacitor element 15 is soldered to the conductive pattern 32 with the solder 23. The thin metal wire 22 is bonded to the wire bonding pad of the anode lead 16 of the capacitor element 15 and the wire bonding pad 33 of the conductive pattern electrode 31 to connect the anode lead 16 to the conductive pattern electrode 31.

Then the flip chip pad 38A formed in the conductive pattern 38 is attached with a bare chip 39 which is a power transistor as a circuit element, for example. Then, the electrode of the bare chip 39 is bonded and connected to the conductive pattern 32 via a thin metal wire 40.

Figure 4C:
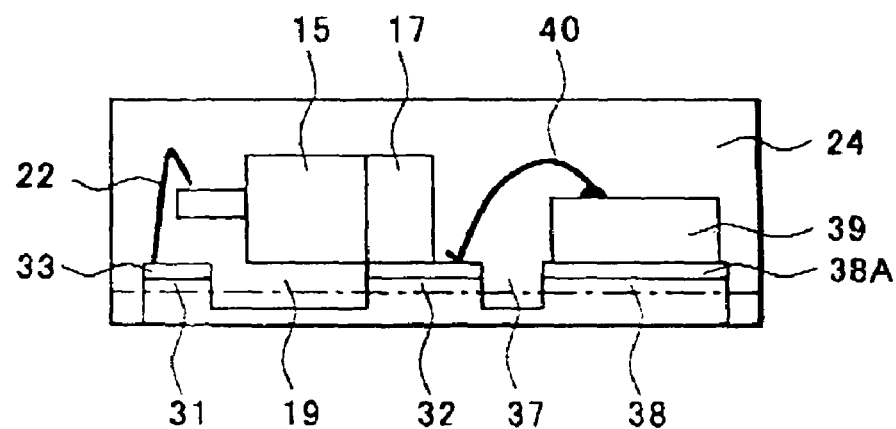

Next, as shown in FIG. 4C, the capacitor element 15, the anode lead 16, the cathode lead 17, the conductive patterns 31, 32, and 38, the bare chip 39, and the thin metal wiring 20 and 40 are entirely covered with the insulating resin 24 and these are supported and fixed.

Figure 4D:
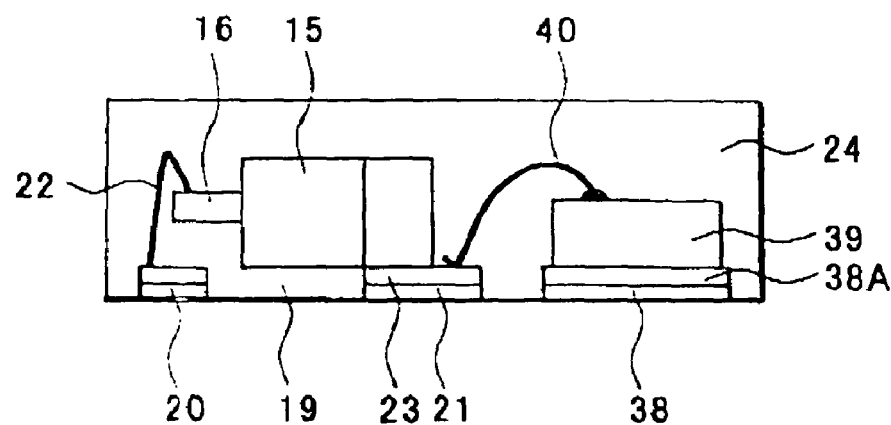

Thereafter, the insulating resin 24 is cut off from the conductive patterns 31, 32, and 38 at the broken line shown in FIG. 4C. As shown in FIG. 4D, this allows the conductive patterns 31, 32, and 33 to be perfectly separated from one another, and the separated part becomes the externally exposed conductive pattern electrodes 20, 21, and 38, thereby forming the hybrid integrated circuit in which the capacitor element is assembled.

Although the power transistor bare chip as an example of the circuit element is given as described above, the circuit element also may be an LSI bare chip and the number of the circuit elements is not limited to one and a plurality of required circuit elements also may be assembled at the same time.

FIG. 5 shows another embodiment of the capacitor device of preferred embodiment of the present invention. In FIG. 1, only the anode lead 16 of the capacitor element 15 and the first conductive pattern electrode 20 are connected via the thin metal wire 22 having a fusing feature. However, the capacitor element 15 is fixed to the pad 42 formed together with the conductive pattern electrodes 20 and 21, and the cathode lead 17 is connected to the second conductive pattern electrode 21 via the thin metal wire 43 having a fusing feature.

Otherwise, details of the structure are the same as in the above, the capacitor element 15, the anode lead 16, the cathode lead 17, and the first and second conductive pattern electrodes 20 and 21 except for the lower faces are covered with the insulating resin 24 and are integrally supported, thereby forming the chip type capacitor device.

Similarly, FIG. 6 shows another example of the capacitor device of preferred embodiment of the present invention, however this differs from FIG. 1 in that the anode lead 16 is slid to extrude from the lower part of the dielectric body. This allows the anode lead 16 and the first conductive pattern electrode 20 to approach each other, thereby facilitating a wire bonding of the thin metal wire 22 to the wire bonding pad of the anode lead 16.

Similarly, FIG. 7 shows another example of the capacitor device of preferred embodiment of the present invention. The face from which the anode lead 16 of the capacitor element 15 is extruded is plated to be flat. The flat plated layer 44 is wire-bonded to one end of the thin metal wire 22 and the other end of the thin metal wire 22 is wire-bonded to the first conductive pattern electrode 20, thereby connecting the anode lead 16 to the conductive pattern electrode 44. Otherwise, details of the structures are the same as in FIG. 5.

As shown in FIG. 7, FIG. 8 shows a capacitor device using the capacitor element 15 with the face from which the anode lead 16 is extruded is flat by use of the plated layer 44. The capacitor element 15 is directed downward in the longitudinal direction of the cathode lead 17. Then, the cathode lead 17 is soldered to the second conductive pattern electrode 21 with the solder 23.

The plated layer 44 positioned at the upper face of the capacitor element 15 is wire-bonded with one end of the thin metal wire 22, while the other end of the thin metal wire 22 is wire-bonded with the first conductive pattern electrode 20, thereby connecting the anode lead 16 to the conductive pattern electrode 44.

As shown in FIG. 4, the methods of FIG. 5 to FIG. 8 also can be applied to a case where the capacitor device as well as other circuit element bare chips are simultaneously covered and supported with an insulating resin. Additionally, it is the same that the capacity of the fusing current is adjusted depending on the number of the thin metal wire 22 or the thin metal wires 43.

As shown in FIG. 4, the methods of FIG. 5 to FIG. 8 also can be applied to a case where the capacitor device as well as other circuit element bare chips are simultaneously covered and supported with an insulating resin. Additionally, it is the same that the capacity of the fusing current is adjusted depending on the number of the thin metal wire 22 or the thin metal wires 43.

What is claimed is:

1. A capacitor device, comprising:
    a plurality of conductive pattern electrodes electrically separated by a separation groove;
    a capacitor element in which at least either one of an anode lead and a cathode lead is connected via a thin metal wire having a fusing feature to the conductive pattern electrode, and
    an insulating resin for covering the capacitor element, the thin metal wire, and the conductive pattern electrode except for a face and for integrally supporting the conductive pattern electrode, the thin metal wire, and the capacitor element.

2. The capacitor device according to claim 1, wherein the anode lead and the cathode lead are both connected to the conductive pattern electrode via the thin metal wire having a fusing feature, respectively.

3. The capacitor device according to claim 1, wherein the anode lead is derived at a dislocated position and is connected to the conductive pattern electrode via the thin metal wire having a fusing feature.

4. The capacitor device according to claim 1, wherein the anode lead is subjected to plating to form a flat section, and which is connected to the conductive pattern electrode via the thin metal wire having a fusing feature.

5. A capacitor device comprising;
    a plurality of conductive pattern electrodes electrically separated by a separation groove;
    a capacitor element in which at least either one of an anode lead and a cathode lead is connected via a thin metal wire having a fusing feature to first and second conductive pattern electrode, respectively,
    a circuit element bare chip attached to the pad of a third conductive pattern electrode; and
    an insulating resin for covering the bare chip, the thin metal wire, and the first, second and third conductive pattern electrodes except for a face and for integrally supporting the first, second and third conductive pattern electrodes, the capacitor element, and the bare chip.

6. The capacitor device according to claim 1 or 5, wherein a capacity of a fusing current is adjusted depending on the number of thin metal wires.

7. The capacitor device according to claim 1 or 5, wherein the capacitor element is made in such a manner that tantalum in the form of metal powders and the anode lead are subjected to pressurization and molding, and a dielectric body is made by a tantalum oxide.

* * * * *